(12) United States Patent
Soejima

(10) Patent No.: US 11,448,505 B2
(45) Date of Patent: Sep. 20, 2022

(54) SENSOR ELEMENT AND ANGULAR VELOCITY SENSOR

(71) Applicant: KYOCERA Corporation, Kyoto (JP)

(72) Inventor: Munetaka Soejima, Soraku-gun (JP)

(73) Assignee: KYOCERA CORPORATION, Kyoto (JP)

( * ) Notice: Subject to any disclaimer, the term of this patent is extended or adjusted under 35 U.S.C. 154(b) by 345 days.

(21) Appl. No.: 16/633,620

(22) PCT Filed: Jul. 13, 2018

(86) PCT No.: PCT/JP2018/026503
§ 371 (c)(1),
(2) Date: Jan. 24, 2020

(87) PCT Pub. No.: WO2019/021860
PCT Pub. Date: Jan. 31, 2019

(65) Prior Publication Data
US 2020/0208972 A1 Jul. 2, 2020

(30) Foreign Application Priority Data
Jul. 24, 2017 (JP) .............................. JP2017-142780

(51) Int. Cl.
*G01C 19/5621* (2012.01)
*H01L 41/113* (2006.01)
(Continued)

(52) U.S. Cl.
CPC ..... *G01C 19/5621* (2013.01); *G01C 19/5607* (2013.01); *G01C 19/5628* (2013.01);
(Continued)

(58) Field of Classification Search
CPC ............ G01C 19/5621; G01C 19/5607; G01C 19/5628; H01L 41/1132; H01L 41/1136; H01L 41/16
See application file for complete search history.

(56) References Cited

U.S. PATENT DOCUMENTS

2010/0162813 A1* 7/2010 Chen .................. G01C 19/5628
250/226
2012/0326570 A1* 12/2012 Nishizawa ............... H03H 3/02
216/13
(Continued)

FOREIGN PATENT DOCUMENTS

| JP | 2013-190305 A | 9/2013 |
| JP | 2016-133428 A | 7/2016 |

*Primary Examiner* — Helen C Kwok
(74) *Attorney, Agent, or Firm* — Volpe Koenig

(57) ABSTRACT

A piezoelectric body of a sensor includes a driving arm and detecting arm which extend from a base part in a y-axis direction. Excitation electrodes vibrate the driving arm in an x-axis direction. Detecting electrodes enable detection of a signal due to deformation in a z-axis direction of the detecting arm. The piezoelectric body has anisotropy causing vibration of torsional deformation when the driving arm vibrates in the x-axis direction. When the driving arm bends to a +x side, the base part flexes so that a connection position in the base part is displaced to one side in the z-axis direction. The cross-section of the driving arm perpendicular to the y-axis direction causes a bending stiffness to the +x side and to the other side in the z-axis direction is smaller than a bending stiffness to the +x side and to the one side in the z-axis direction.

8 Claims, 10 Drawing Sheets

(51) Int. Cl.
*H01L 41/16* (2006.01)
*G01C 19/5607* (2012.01)
*G01C 19/5628* (2012.01)

(52) U.S. Cl.
CPC ...... *H01L 41/1132* (2013.01); *H01L 41/1136* (2013.01); *H01L 41/16* (2013.01)

(56) References Cited

U.S. PATENT DOCUMENTS

| | | | |
|---|---|---|---|
| 2016/0087190 A1* | 3/2016 | Ishii | H03H 9/21 310/317 |
| 2016/0282117 A1* | 9/2016 | Nakagawa | G01C 19/5607 |
| 2019/0229706 A1* | 7/2019 | Ogura | H03H 9/0595 |

* cited by examiner

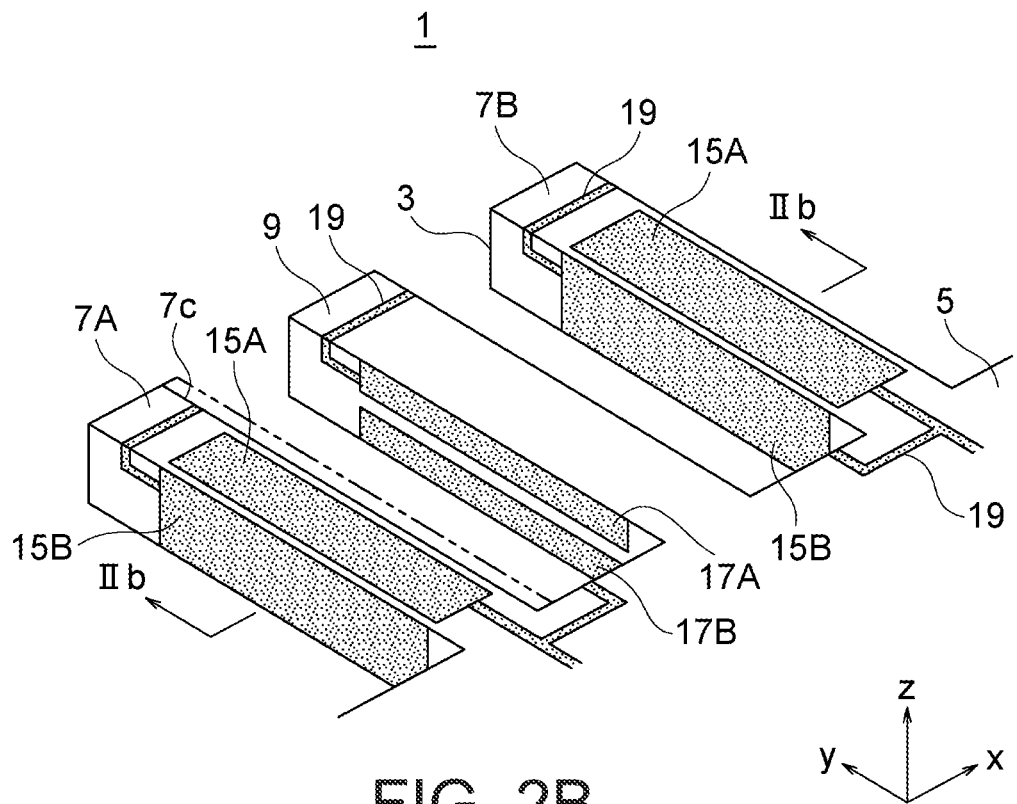
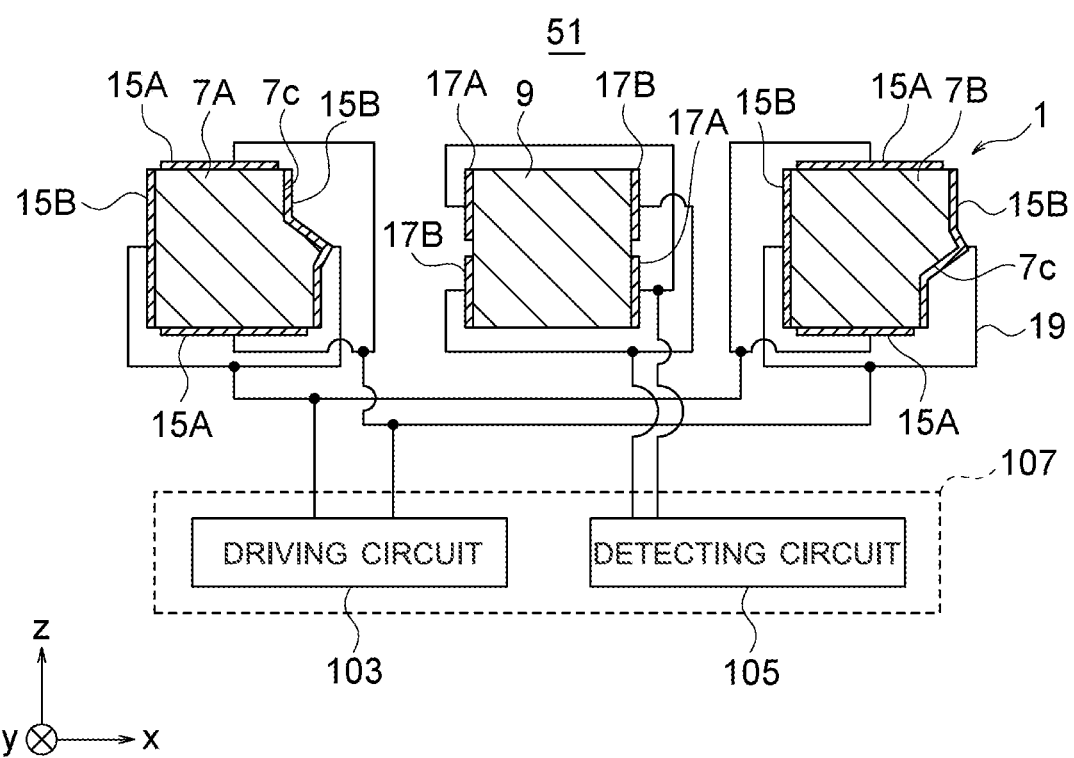

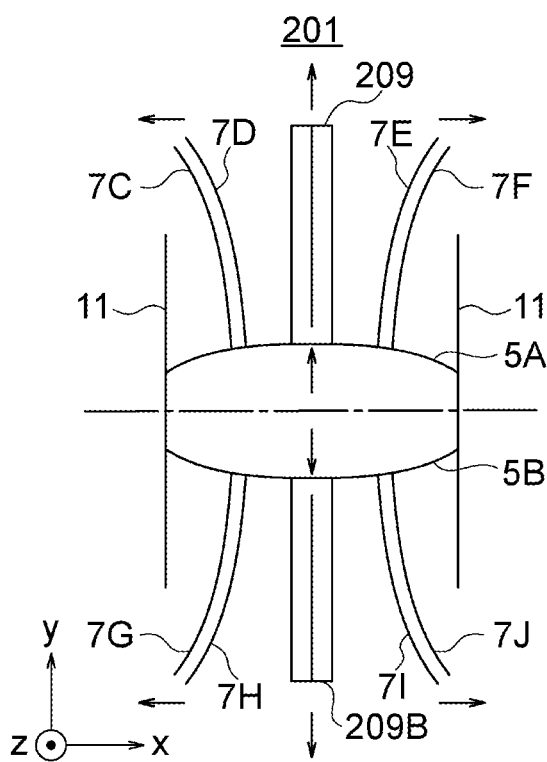
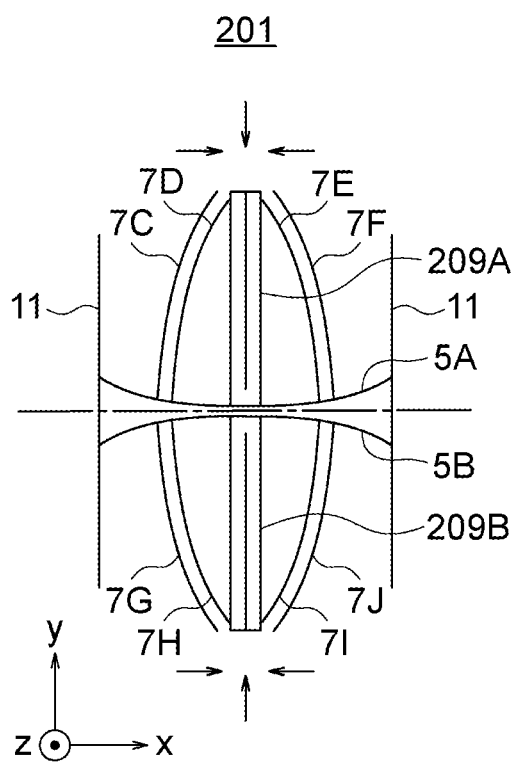
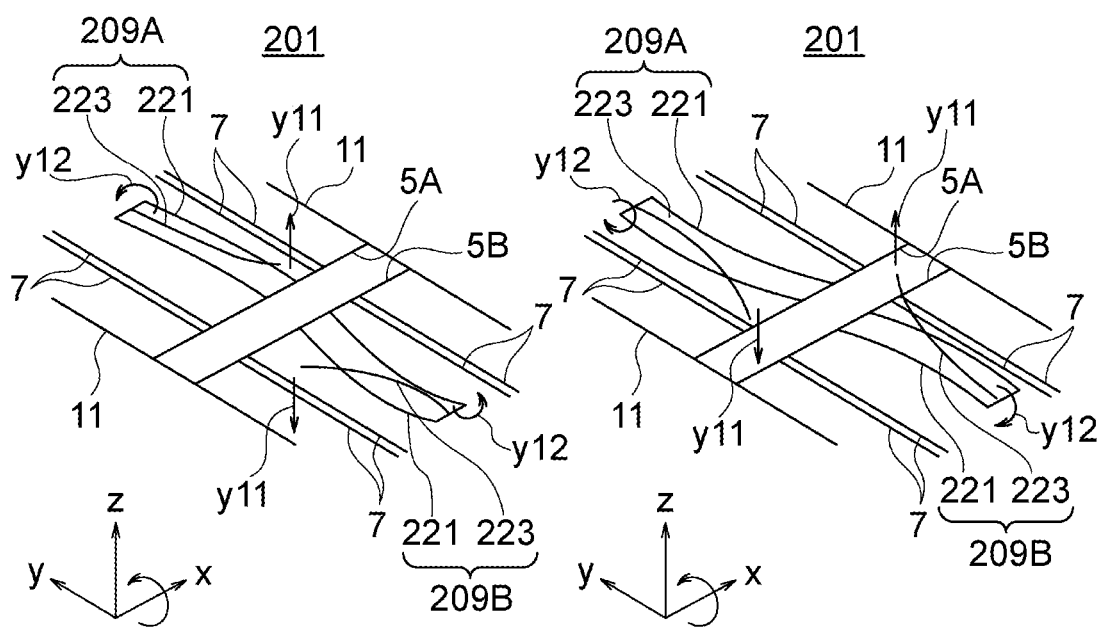

SENSOR ELEMENT AND ANGULAR VELOCITY SENSOR

TECHNICAL FIELD

The present disclosure relates to a sensor element and an angular velocity sensor including the sensor element.

BACKGROUND ART

Known in the art (for example Patent Literature 1 and 2) is a piezoelectric vibration type angular velocity sensor utilizing vibration of a piezoelectric body. The piezoelectric body is for example configured by a quartz crystal and has a base part and has a driving arm and a detecting arm which extend from the base part. The driving arm vibrates when an AC voltage is supplied. When the piezoelectric body is rotated in this state, a Coriolis force with a magnitude in accordance with the rotation speed (angular velocity) is generated in a direction perpendicular to the direction of vibration. The detecting arm vibrates due to this Coriolis force. By detecting an electrical signal generated in accordance with the vibration of the detecting arm, the angular velocity is detected.

Patent Literature 1 discloses a sensor element in which a driving arm having a transverse cross-section of rectangular shape with corner portions on the two sides of one diagonal line cut away is made to vibrate in a direction of the other diagonal line. Patent Literature 2 discloses the possibility of the driving arm ending up vibrating at a slant relative to an intended vibration direction due to residue of etching at the root of the driving arm when the piezoelectric body in the sensor element is shaped by etching.

CITATION LIST

Patent Literature

Patent Literature 1: Japanese Patent Publication No. 2013-190305
Patent Literature 2: Japanese Patent Publication No. 2016-133428

SUMMARY OF INVENTION

A sensor element according to one aspect of the present disclosure includes a piezoelectric body, a plurality of excitation electrodes, and a plurality of detecting electrodes. The piezoelectric body includes a base part and includes a driving arm and detecting arm which extend from the base part in a y-axis direction in an orthogonal coordinate system xyz and is configured by a single crystal. The plurality of excitation electrodes are located on the driving arm in an arrangement enabling vibration of the driving arm in an x-axis direction. The plurality of detecting electrodes are located on the detecting arm in an arrangement enabling detection of a signal generated due to bending deformation in a z-axis direction of the detecting arm. The piezoelectric body has anisotropy relative to a crystal orientation making the driving arm cause vibration of torsional deformation when the driving arm vibrates in the x-axis direction. An orientation of the torsional deformation when the driving arm bends to a +x side is an orientation making the base part flex so that a connection position in the base part with the detecting arm is displaced to one side in the z-axis direction. A shape of a cross-section of the driving arm perpendicular to the y-axis direction is a shape where a bending stiffness to the +x side and to the other side in the z-axis direction is smaller than a bending stiffness to the +x side and to the one side in the z-axis direction.

An angular velocity sensor of the present disclosure includes the sensor element described above, a driving circuit supplying voltages to the plurality of excitation electrodes, and a detecting circuit detecting the signals from the plurality of detecting electrodes.

BRIEF DESCRIPTION OF DRAWINGS

FIG. 2A is a perspective view showing a portion of the sensor element in FIG. 1 in an enlarged manner, and FIG. 2B is a cross-sectional view taken along the IIb-IIb line in FIG. 2A.

FIG. 8A, FIG. 8B, FIG. 8C, and FIG. 8D are schematic views for explaining the action of the sensor element in FIG. 6.

DESCRIPTION OF EMBODIMENTS

Below, embodiments according to the present disclosure will be explained with reference to the drawings. The following drawings are schematic ones. Therefore, details will be sometimes omitted. Further, size ratios and the like do not always coincide with the actual ones. Further, size ratios in the plurality of drawings do not always coincide with each other.

Further, to each of the drawings, an orthogonal coordinate system xyz is attached. The orthogonal coordinate system xyz is defined based on the shape of the sensor element (piezoelectric body). That is, the x-axis, y-axis, and z-axis do not always indicate an electrical axis (X-axis), mechanical axis (Y-axis), and optical axis (Z-axis) of a crystal. The sensor element may be used so that any direction is defined as "above" or "below". In the following explanation, however, for convenience, sometimes the "upper surface" or "lower surface" and other terms will be used where the positive side in the z-axis direction is the upper part.

Further, the same or similar configurations are sometimes assigned additional notations of letters of the alphabet which are different from each other such as with the "driving arm 7A" and "driving arm 7B". Further, in this case, sometimes the configurations will be simply referred to as the "driving arms 7" and will not be differentiated.

In the second and following embodiments, configurations which are common or similar to the configurations in the already explained embodiments use notations which were attached to the configurations in the already explained embodiments. Further, sometimes illustration and explanations will be omitted. For configurations corresponding (similar) to the configurations in the already explained embodiments, even in a case where notations which are different from those for the configurations in the already explained embodiments are attached, the matters are the same configurations as those in the already explained embodiments unless particularly explained otherwise.

First Embodiment

Figure 1:
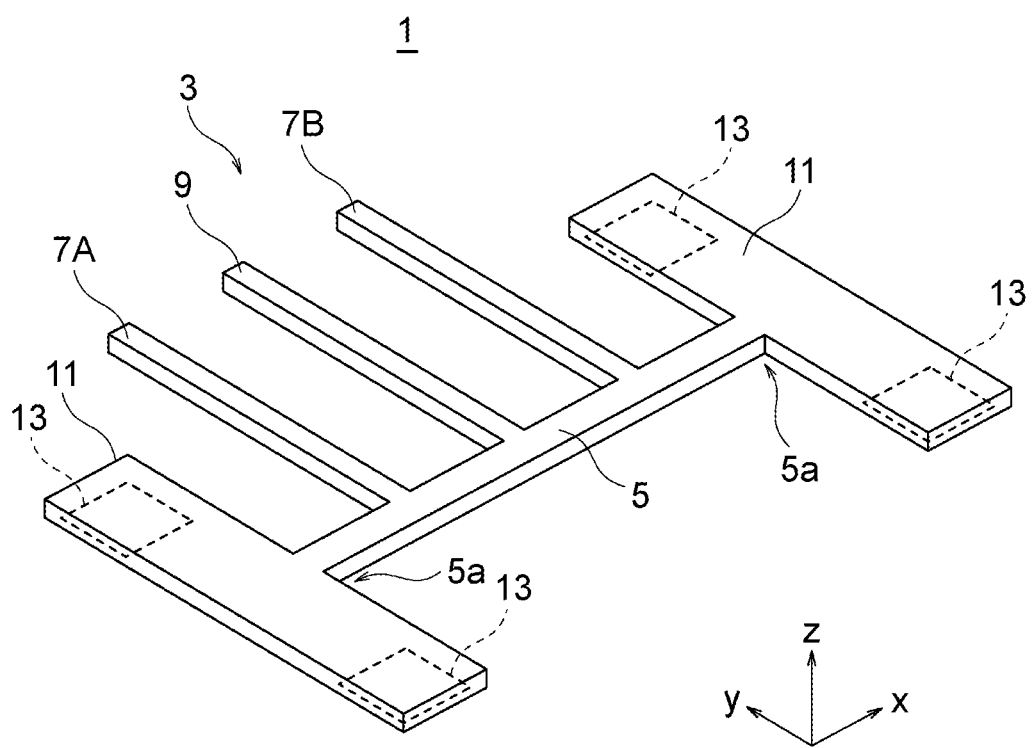
FIG. 1 is a perspective view showing a piezoelectric body in a sensor element according to a first embodiment of the present disclosure.

FIG. 1 is a perspective view showing the configuration of a sensor element 1 according to a first embodiment. However, in this view, basically illustration of a conductive layer which is provided on the surface of the sensor element 1 is omitted.

The sensor element 1 for example configures an angular velocity sensor 51 (notation is shown in FIG. 2B) of a piezoelectric vibration type which detects the angular velocity around the x-axis. The sensor element 1 has a piezoelectric body 3. When the piezoelectric body 3 is rotated in a state where voltage is supplied to the piezoelectric body 3 and the piezoelectric body 3 is vibrating, vibration is generated due to a Coriolis force in the piezoelectric body 3. By detecting the voltage generated due to the vibration by this Coriolis force, the angular velocity is detected. Specifically, this is as follows.

(Schematic Shape of Piezoelectric Body)

The piezoelectric body 3 is for example formed integrally as a whole. The piezoelectric body 3 is for example a single crystal. Further, the material for the piezoelectric body 3 may be suitably selected. For example, it is a quartz crystal ($SiO_2$), $LiTaO_3$, $LiNbO_3$, PZT (lead zirconate titanate), or silicon. Below, the case of quartz crystal will be taken as an example.

In the piezoelectric body 3 (crystal), the x-axis, y-axis, and z-axis for example substantially coincide with the electrical axis (X-axis), mechanical axis (Y-axis), and optical axis (Z-axis). However, they may be inclined within a predetermined range as well. For example, each of an inclination angle of the x-axis relative to the X-axis, the inclination angle of the y-axis relative to the Y-axis, and the inclination angle of the z-axis relative to the Z-axis is $-10°$ to $10°$.

The piezoelectric body 3 is for example made constant in thickness (z-axis direction) as a whole. Further, the schematic shape of the piezoelectric body 3 (for example excluding cut away portions 7c which will be explained later) is for example a line symmetrical shape relative to a not shown symmetrical axis parallel to the y-axis.

The piezoelectric body 3 for example has a base part 5, a pair of driving arms 7A and 7B and a detecting arm 9 which extend from the base part 5, and a pair of mounting parts 11 which support the base part 5.

The pair of driving arms 7 are portions which are excited by supply of voltage (electric field). The detecting arm 9 is a portion which vibrates due to the Coriolis force and generates an electrical signal (for example voltage) in accordance with the angular velocity. The base part 5 is a portion which contributes to support of the driving arms 7 and detecting arm 9 and transfer of vibration from the driving arms 7 to the detecting arm 9. The mounting parts 11 are portions contributing to mounting of the sensor element 1 on a not shown mounting substrate (for example a portion of a package or a circuit board).

The base part 5 is for example made a long shape so as to linearly extend in the x-axis direction. The two ends thereof become supported parts 5a which are supported by the pair of mounting parts 11. Accordingly, the base part 5 becomes able to flexurally deform like a beam supported at its two ends.

The shape of a transverse cross-section (yz cross-section) of the base part 5 is for example schematically rectangular. Either of the width (y-axis direction) or thickness (z-axis direction) of the base part 5 may be larger than the other as well. For example, the width of the base part 5 may be made 2 times or less or made 1 time or less of the thickness of the base part 5. Further, for example, the length and width of the base part 5 may be adjusted so that the natural frequency of the flexural deformation in the y-axis direction becomes closer to the natural frequency of the driving arms 7 in a direction in which they are excited by application of voltage and/or the natural frequency of the detecting arm 9 in a direction in which it vibrates due to the Coriolis force.

The driving arms 7 extend from the base part 5 in the y-axis direction. Their front ends are formed as free ends. Accordingly, the driving arms 7 become able to flexurally deform in a cantilever manner. The pair of driving arms 7 extend alongside each other (for example in parallel) at positions separated from each other in the x-axis direction. The pair of driving arms 7 are for example provided line symmetrically relative to a not shown symmetrical axis which passes through the center between the pair of supported parts 5a and is parallel to the y-axis. Further, the pair of driving arms 7 are connected with the base part 5 at positions apart from the pair of supported parts 5a.

The driving arms 7 are excited in the x-axis direction as will be explained later. Accordingly, in the driving arms 7, the larger the width (x-axis direction), the higher the natural frequency in the excitation direction (x-axis direction). Further, the larger the length (mass from another viewpoint), the lower the natural frequency in the excitation direction. The various dimensions of the driving arms 7 are for example set so that the natural frequency in the excitation direction of the driving arms 7 becomes close to the frequency at which excitation is desired be caused.

The detecting arm 9 extends from the base part 5 in the y-axis direction. Its front end is formed as a free end. Accordingly, the detecting arm 9 becomes able to flexurally deform in a cantilever manner. Further, the detecting arm 9 extends between the pair of driving arms 7 alongside (for example in parallel to) the pair of driving arms 7. The detecting arm 9 is for example positioned at the center between the pair of supported parts 5a and/or positioned at the center between the pair of driving arms 7.

The detecting arm 9, as will be explained later, in the present embodiment, vibrates in the z-axis direction due to the Coriolis force. Accordingly, in the detecting arm 9, the larger the thickness (z-axis direction), the higher the natural frequency in the vibration direction (z-axis direction). Further, the larger the length (mass from another viewpoint), the lower the natural frequency in the vibration direction. The various dimensions of the detecting arm 9 are for example set so that the natural frequency in the vibration direction of the detecting arm 9 becomes close to the natural frequency in the excitation direction of the driving arms 7. The length of the detecting arm 9 is for example equal to the lengths of the driving arms 7. However, the two may be different as well.

The pair of mounting parts 11 are for example formed in shapes having the y-axis direction as their long directions. The lengths, widths, and thicknesses of the mounting parts 11 may be suitably set.

The lower surfaces of the pair of mounting parts 11 are provided with at least four pads 13. The pads 13 face not shown pads provided on mounting substrate and are bonded with respect to the pads on the mounting substrate by bumps made of solder or conductive adhesive. Due to this, electrical connection of the sensor element 1 and the mounting substrate is achieved. Further, the sensor element 1 (piezoelectric body 3) is supported in a state where the driving arms 7 and detecting arm 9 can vibrate. The four pads 13 are for example provided on the two ends of the pair of mounting parts 11.

(Shapes of Transverse Cross-Sections of Driving Arms and Detecting Arm)

FIG. 2A is a perspective view showing a portion of the sensor element 1 in an enlarged manner. Further, FIG. 2B is a cross-sectional view taken along the IIb-IIb line in FIG. 2A.

The transverse cross-section of each driving arm 7 (xz cross-section, below, for the driving arm 7, when simply referring to the "cross-section", it designates the transverse cross-section) is for example substantially constant over the long direction. The cross-sectional shape of the driving arm 7 is for example schematically a rectangular shape with one corner portion cut away as shown in FIG. 2B (cut away portion 7c is provided). In FIG. 2A, for reference, a shape of the driving arm 7A not provided with a cut away portion 7c is indicated by a two-dotted chain line.

If the cut away portion 7c is provided as described above, in the driving arm 7, compared with a bending stiffness in a direction of a diagonal line connecting the two corners which are not notched, the bending stiffness in a direction of a diagonal line which passes through the cut away corner portion becomes smaller. As a result, for example, when a force making the driving arm 7 vibrate in the x-axis direction is added, the vibration direction is inclined relative to the x-axis direction to the side along the diagonal line passing through the cut away corner portion.

More specifically, for example, in the driving arm 7A which is positioned on the −x side relative to the detecting arm 9, the corner portion on the +x side and on the +z side is notched. Further, in the driving arm 7B which is positioned on the +x side relative to the detecting arm 9, the corner portion on the +x side and on the −z side is notched.

Expressed another way focusing on the bending stiffness, in the driving arm 7A positioned on the −x side relative to the detecting arm 9, the bending stiffness to the +x side (detecting arm side) and to the +z side is made smaller than the bending stiffness to the +x side and to the −z side. Further, in the driving arm 7B positioned on the +x side relative to the detecting arm 9, the bending stiffness to the −x side (detecting arm side) and to the +z side is made smaller than the bending stiffness to the −x side and to the −z side. That is, in the two driving arms 7, the bending stiffness on the detecting arm side and +z side is made relatively smaller.

In the driving arm 7A, whether the bending stiffness to the +x side and to the +z side is smaller than the bending stiffness to the +x side and to the −z side may be judged according to for example whether a second moment of area with respect to an axis which is inclined counterclockwise by 45° relative to the z-axis is smaller than the second moment of area with respect to an axis which is inclined clockwise by 45° relative to the z-axis at the xz cross-section of the driving arm 7A. In the same way, in the driving arm 7B, whether the bending stiffness to the −x side and to the +z side is smaller than the bending stiffness to the −x side and to the −z side may be judged according to for example whether the second moment of area with respect to an axis which is inclined clockwise by 45° relative to the z-axis is smaller than the second moment of area with respect to an axis which is inclined counterclockwise by 45° relative to the z-axis.

The shape and size of the cut away portion 7c may be suitable ones. In the example shown, the cut away portion 7c is schematically comprised by a surface (notation is omitted) which intersects the upper surface or lower surface and is substantially parallel to the z-axis and a surface (notation is omitted) which is inclined relative to the former surface and intersects a region which is not cut away in the side surface on the +x side of the driving arm 7. Further, in FIG. 2B, also a small projection (notation is omitted, it will be omitted in the following drawings) is formed at the cut away side surface of the driving arm 7. The surfaces configuring the cut away portion 7c are for example comprised of crystal faces which appear by etching which will be explained later.

The shape of the transverse cross-section (xz cross-section, below, for the detecting arm 9, when simply referring to the "cross-section", it designates the transverse cross-section) is for example substantially constant over the long direction. The cross-sectional shape of the detecting arm 9 is for example schematically rectangular as shown in FIG. 2B.

(Excitation Electrodes, Detecting Electrodes, and Wirings)

The sensor element 1 has excitation electrodes 15A and 15B for supplying voltages to the driving arms 7, detecting electrodes 17A and 17B for extracting signals generated in the detecting arm 9, and a plurality of wirings 19 for connecting them. They are configured by conductor layers formed on the surface of the piezoelectric body 3. The materials for the conductor layers are for example Cu, Al, or another metal.

The additional notations A and B of the excitation electrodes 15 and detecting electrodes 17 are attached based on the orthogonal coordinate system xyz. Accordingly, as will be explained later, the excitation electrode 15A on one driving arm 7 and the excitation electrode 15A on the other driving arm 7 do not always have the same potential. The same is true for the excitation electrodes 15B. The same is true for the detecting electrodes 17A and 17B in a mode where a plurality of detecting arms 9 are provided (embodiments which will be explained later).

The excitation electrodes 15A are respectively provided in the driving arms 7 at the upper surfaces and lower surfaces (pairs of surfaces facing the two sides in the z-axis direction). Further, the excitation electrodes 15B are respectively provided in the driving arms 7 at the pairs of side surfaces (pairs of surfaces facing the two sides in the x-axis direction). Concerning arrangements of the excitation electrodes 15, surfaces configuring the cut away portions 7c for example may be treated as single portions of the side surfaces as in the example shown (the excitation electrodes 15B may be provided). However, in the cut away portions 7c, according to their shapes and/or sizes, part or all of those may be treated as single portions of the upper surfaces or lower surfaces (the excitation electrodes 15A may be provided) or may be treated as belonging to neither the upper surfaces or lower surfaces nor the side surfaces (no excitation electrode 15 may be provided).

In the embodiments which will be explained later, sometimes provision is made of driving arms 7 which extend from the base part 5 toward the negative side in the y-axis direction. In such driving arms 7 as well, the additional notations "A" of the excitation electrodes 15 correspond to the upper surfaces and lower surfaces, and the additional notations "B" of the excitation electrodes 15 correspond to the side surfaces.

On the upper, lower, left, and right surfaces of the driving arms 7, the excitation electrodes 15 are for example formed so as to cover the majorities of the surfaces. However, at least one of each two excitation electrodes 15A and 15B (excitation electrodes 15A in the present embodiment) is formed smaller in the width direction than the surface so that the electrodes are not short-circuited with each other. Further, parts of the root sides and front end sides of the driving arms 7 may be made positions where no excitation electrodes 15 are arranged.

At the driving arms 7, the two excitation electrodes 15A are for example rendered the same potentials as each other. For example, the two excitation electrodes 15A are connected to each other by the wiring 19. Further, at the driving arms 7, the two excitation electrodes 15B are for example rendered the same potentials as each other. For example, the two excitation electrodes 15B are connected to each other by the wiring 19.

In such an arrangement and connection relationships of the excitation electrodes 15, if voltage is supplied between the excitation electrodes 15A and the excitation electrodes 15B, for example, in the driving arms 7, an electric field from the upper surface toward the pair of side surfaces (two sides in the x-axis direction) and an electric field from the lower surface toward the pair of side surfaces are generated. On the other hand, the polarization axis (electrical axis) matches with the x-axis direction. Accordingly, when focusing on the components in the x-axis direction of the electric fields, in the driving arm 7, the orientation of the electric field and the orientation of the polarization axis match in one side portion of the x-axis direction, while the orientation of the electric field and the orientation of the polarization axis become inverse to each other in the other side portion.

As a result, single side portions of the driving arms 7 in the x-axis direction contract in the y-axis direction, and the other side portions extend in the y-axis direction. Therefore, the driving arms 7 flex to one side in the x-axis direction like a bimetal. If the voltages supplied to the excitation electrodes 15A and 15B are inverted, the driving arms 7 flex to an inverse direction. According to such a principle, if an AC voltage is supplied to the excitation electrodes 15A and 15B, the driving arms 7 vibrate in the x-axis direction.

Between the pair of driving arms 7, the excitation electrodes 15A on the driving arm 7A and the excitation electrodes 15B on the driving arm 7B are given the same potential, while the excitation electrodes 15B on the driving arm 7A and the excitation electrodes 15A on the driving arm 7B are given the same potential. The excitation electrodes 15 which must be given the same potential are for example connected to each other by the wirings 19.

Accordingly, if applying AC voltage between the excitation electrodes 15A and the excitation electrodes 15B in such connection relationships, voltages having inverse phases from each other are supplied to the pair of driving arms 7, therefore the arms vibrate so as to flexurally deform in reverse orientations to each other in the x-axis direction.

The detecting electrodes 17A in the detecting arm 9 are provided in regions on the positive side in the z-axis direction (for example, the sides more positive than the centers of the surfaces) in the surfaces facing the negative side in the x-axis direction and in the regions on the negative side in the z-axis direction (for example, the sides more negative than the centers of the surfaces) in the surfaces facing the positive side in the x-axis direction. The detecting electrodes 17B in the detecting arm 9 are provided in regions on the negative side in the z-axis direction (for example, the sides more negative than the centers of the surfaces) in the surfaces facing the negative side in the x-axis direction and in the regions on the positive side in the z-axis direction (for example, the sides more positive than the centers of the surfaces) in the surfaces facing the positive side in the x-axis direction.

In the embodiments which will be explained later, sometimes provision is made of a detecting arm 9 which extends from the base part 5 to the negative side in the y-axis direction. In such a detecting arm 9 as well, the additional notations "A" of the detecting electrodes 17 correspond to the regions of +z in the side surfaces of −x and the regions of −z in the side surfaces of +x, while the additional notations "B" of the detecting electrodes 17 correspond to the regions of −z in the side surfaces of −x and the regions of +z in the side surfaces of +x.

At the side surfaces of the detecting arm 9, the detecting electrodes 17A and 17B extend along the detecting arm 9 so that they are separated by suitable intervals so as not to short-circuit with each other. The two detecting electrodes 17A are for example connected with each other by the wiring 19. Further, the two detecting electrodes 17B are for example connected with each other by the wiring 19.

In such an arrangement and connection relationships of the detecting electrodes 17, if the detecting arm 9 flexurally deforms in the z-axis direction, for example, an electric field parallel to the z-axis direction is generated. That is, at the side surfaces of the detecting arm 9, voltage is generated between the detecting electrodes 17A and the detecting electrodes 17B. The orientations of the electric fields are determined by the orientation of the polarization axes and the orientation of flexes (positive side or negative side in the z-axis direction), and are inverse to each other between the positive side portions and the negative side portions in the x-axis direction. These voltages (electric fields) are output to the detecting electrodes 17A and the detecting electrodes 17B. When the detecting arm 9 vibrates in the z-axis direction, the voltages are detected as the AC voltage. Among the electric fields, electric fields parallel to the z-axis direction may be dominant as described above or a ratio of the electric fields which are parallel to the x-axis direction and have inverse orientations to each other between the positive side portions and the negative side portions in the z-axis direction may be larger. In any case, voltages in accordance with the flexural deformation of the detecting arm 9 in the z-axis direction are generated between the detecting electrodes 17A and the detecting electrodes 17B.

The plurality of wirings 19 connect the plurality of excitation electrodes 15 to each other and connect the plurality of detecting electrodes 17 to each other as explained above. Further, the plurality of wirings 19 connect four sets of electrodes in total, comprised of the excitation electrodes 15 which are divided into two sets from a viewpoint of potentials and the detecting electrodes 17 divided into two sets from a viewpoint of potentials, and the four pads 9. By suitable arrangement of the plurality of wirings 19 on the upper surfaces, lower surfaces, and/or side surfaces of various parts in the piezoelectric body 3, the connections explained above can be realized without short-circuiting with each other in a mode where the entireties of wirings 19 are provided on the surfaces of the piezoelectric body 3. However, three-dimensional wiring portions may be formed by providing an insulation layer on the wirings 19 positioned on the piezoelectric body 3 and providing other wirings 19 above the same.

As shown in FIG. 2B, the angular velocity sensor 51 including the sensor element 1 for example has a driving circuit 103 supplying voltages to the excitation electrodes 15 and a detecting circuit 105 detecting electrical signals from the detecting electrodes 17.

The driving circuit 103 is for example configured including an oscillation circuit and amplifier and supplies an AC voltage having a predetermined frequency between the excitation electrodes 15A and the excitation electrodes 15B. The frequency may be determined in advance in the angular velocity sensor 51 or may be designated from an external apparatus or the like.

The detecting circuit 105 is for example configured including an amplifier and wave detecting circuit, detects a potential difference between the detecting electrode 17A and the detecting electrode 17B, and outputs an electrical signal in accordance with the detection result to an external apparatus or the like. More specifically, for example, the potential difference described above is detected as the AC voltage, and the detecting circuit 105 outputs a signal in accordance with the amplitude of the detected AC voltage. The angular velocity is identified based on this amplitude. Further, the detecting circuit 105 outputs a signal in accordance with a phase difference between the applied voltage of the driving circuit 103 and the electrical signal which was detected. The orientation of rotation is identified based on this phase difference.

The driving circuit 103 and detecting circuit 105 configure a control circuit 107 as a whole. The control circuit 107 is for example configured by a chip IC (integrated circuit) and is mounted on a circuit board or a mounting body having a suitable shape on which the sensor element 1 is mounted.

(Basic Operation of Angular Velocity Sensor)

Figure 3A:
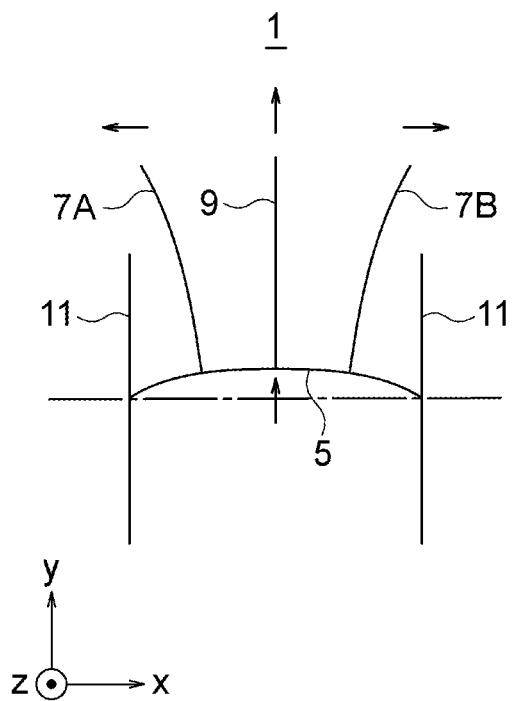
FIG. 3A, FIG. 3B, FIG. 3C, and FIG. 3D are schematic views for explaining the action of the sensor element in FIG. 1.
Figure 3B:
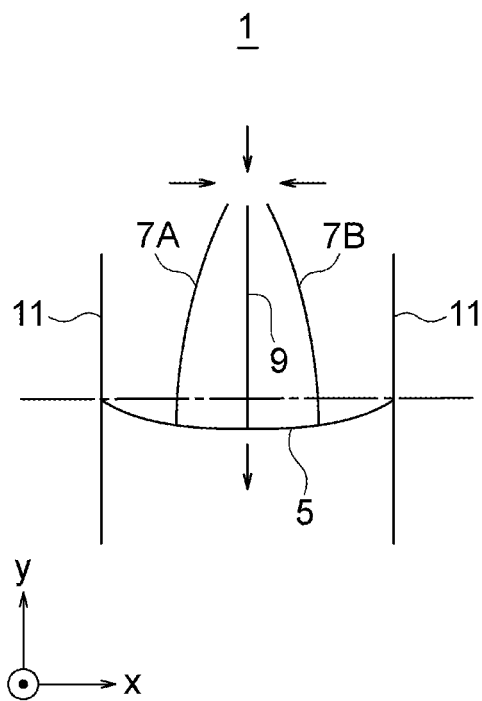

FIG. 3A and FIG. 3B are schematic plan views for explaining excitation of the piezoelectric body 3. In the two views, phases of AC voltages supplied to the excitation electrodes 15 are offset by 180° from each other.

As explained above, the driving arms 7A and 7B are excited with inverse phases from each other so as to deform in inverse orientations to each other in the x-axis direction by application of AC voltages to the excitation electrodes 15.

At this time, as shown in FIG. 3A, if the pair of driving arms 7 flex to the outer sides in the x-axis direction relative to each other (sides where the pair of driving arms are separated from each other), the bending moments thereof are transferred to the base part 5, and the base part 5 flexes to the positive side in the y-axis direction. As a result, the detecting arm 9 is displaced to the positive side in the y-axis direction.

Conversely, as shown in FIG. 3B, if the pair of driving arms 7 flex to the inner sides in the x-axis direction relative to each other (sides where the pair of driving arms become closer to each other), the bending moments thereof are transferred to the base part 5, and the base part 5 is displaced to the negative side in the y-axis direction. As a result, the detecting arm 9 is displaced to the negative side in the y-axis direction.

Accordingly, due to excitation of the pair of driving arms 7, the detecting arm 9 vibrates in the y-axis direction.

Figure 3C:
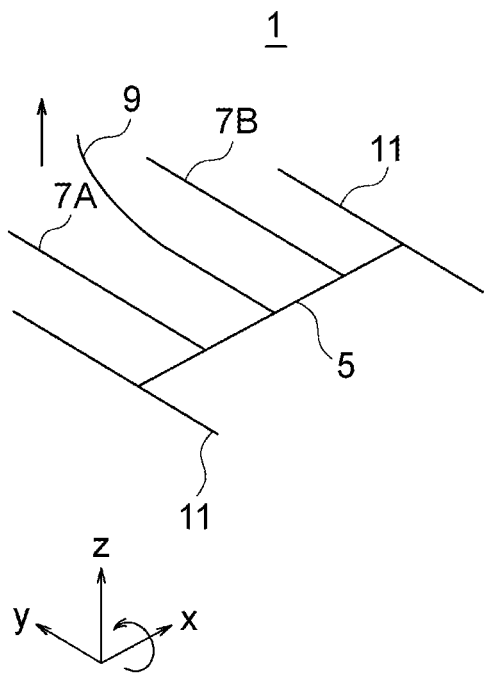
Figure 3D:
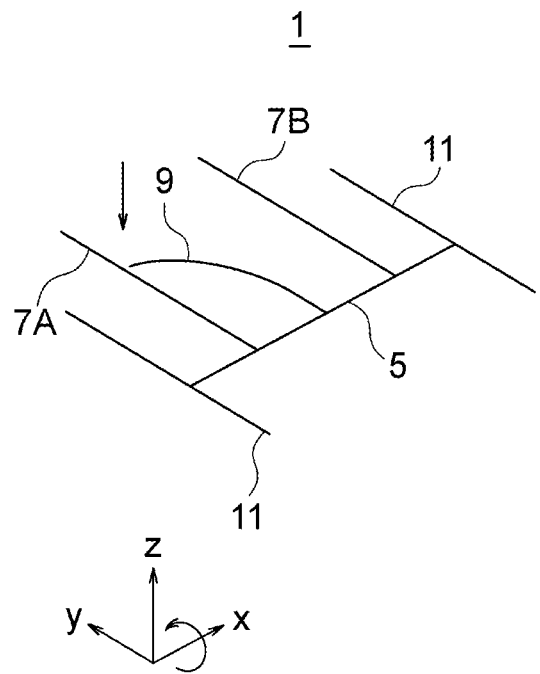

FIG. 3C and FIG. 3D are schematic perspective views for explaining the vibration of the detecting arm 9 due to the Coriolis force. FIG. 3C and FIG. 3D correspond to the states in FIG. 3A and FIG. 3B.

If the sensor element 1 is rotated around the x-axis in a state where the piezoelectric body 3 is vibrating as explained with reference to FIG. 3A and FIG. 3B, the detecting arm 9 vibrates (is displaced) in the direction (z-axis direction) perpendicular to the rotation axis (x-axis) and to the vibration direction (y-axis) due to the Coriolis force since it is vibrating (displaced) in the y-axis direction. The signal (voltage) generated due to this deformation is extracted by the detecting electrodes 17 as explained above. The larger the angular velocity, the larger the Coriolis force (in turn the voltage of the detected signal). Due to this, the angular velocity is detected.

(Generation and Reduction of Unwanted Vibration)

Figure 4A:
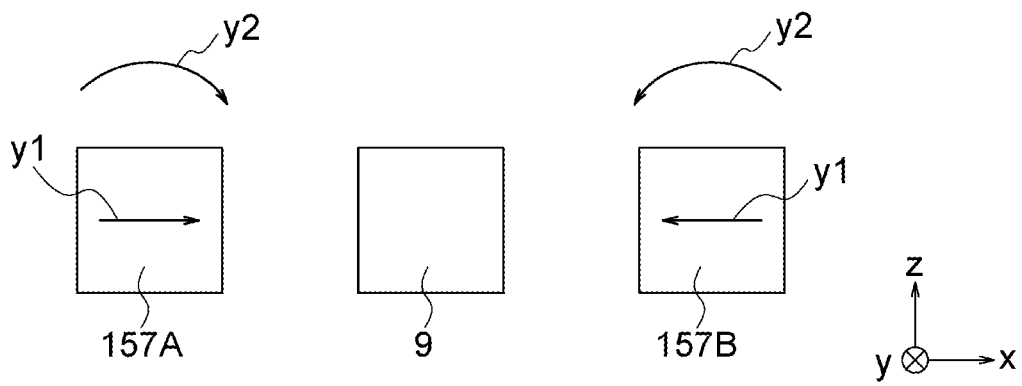
FIG. 4A, FIG. 4B, and FIG. 4C are schematic views for explaining one example of the action of cut away portions in driving arms.

FIG. 4A is a schematic cross-sectional view for explaining operations of a pair of driving arms 157A and 157B and a detecting arm 9 according to a comparative example (however, not prior art, but new). For convenience, hatching for the cross-section is omitted, and illustration of the excitation electrodes 15, detecting electrodes 17, and the like is omitted.

The comparative example is basically the same as the embodiments except that no cut away portion 7c is provided. In such a comparative example, it is assumed that voltages are supplied to the driving arms 157 by the excitation electrodes 15 and that the pair of driving arms 157 flexurally deform to the detecting arm 9 side as indicated by arrows y1. At this time, as indicated by arrows y2, due to anisotropies of the driving arms 157 relative to the crystal orientation, torsional deformations are caused in the driving arms 157. Torsional deformation, more specifically, in the example shown, is one in which the side surface on the detecting arm 9 side in a driving arm 157 displaces to the −z side. The anisotropy for example appears in the inverse piezoelectric effect and/or material strength.

Figure 4B:
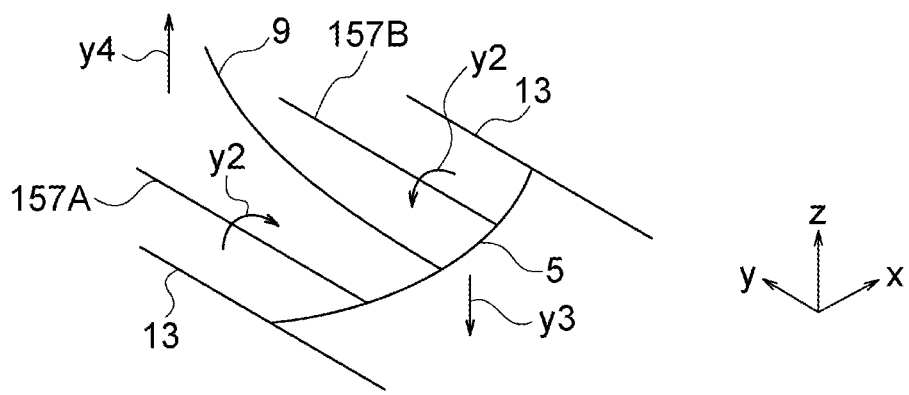

FIG. 4B is a schematic view for explaining an influence of the torsional deformations in FIG. 4A exerted upon the detecting arm 9.

Moments making the driving arms 157 torsionally deform (indicated by arrows y2 in the same way as in FIG. 4A) make the base part 5 flexurally deform. Specifically, in the example shown, in accordance with the torsional deformations making the side surfaces on the detecting arm 9 side in the driving arms 157 displace to the −z side, the base part 5, as indicated by an arrow y3, causes flexural deformation where the side closer to the detecting arm 9 than the driving arms 157 is relatively displaced to the −z side. From another viewpoint, in accordance with the torsional deformations of the pair of driving arms 157 making the surfaces on the inner sides of the pair of driving arms 157 to the −z side, the base part 5 causes flexing where the portion between the pair of driving arms 157 (center side) is relatively displaced to the −z side.

Further, when the connection portion of the base part 5 and the detecting arm 9 is relatively displaced to the −z side due to the flexing of the base part 5, as indicated by an arrow y4, the detecting arm 9 flexurally deforms to the inverse side (+z side) to a displacement of the connection portion so as balance with the displacement.

In this way, in the driving arms 157, unintended torsional deformations (arrows y2) occur. The detecting arm 9 flexurally deforms in the z-axis direction due to this. That is, the detecting arm 9 ends up flexurally deforming in the z-axis direction irrespective of the Coriolis force. In turn, an error occurs in the results of detection.

Figure 4C:
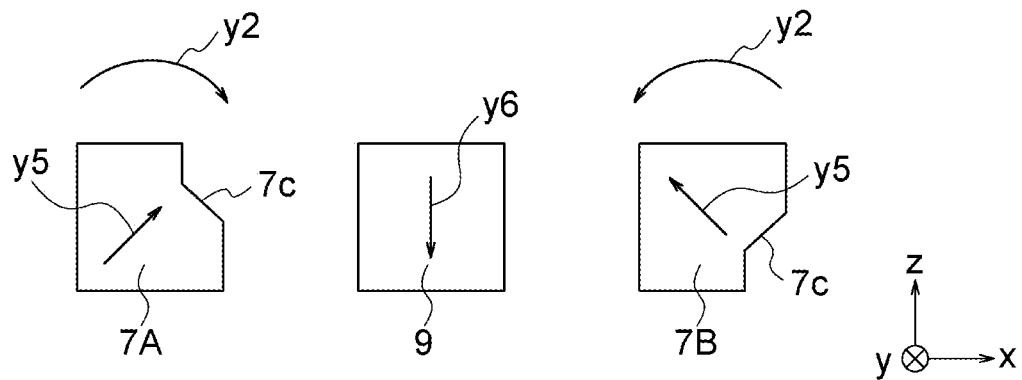

FIG. 4C is a schematic cross-sectional view the same as FIG. 4A for explaining the operations of the pair of driving arms 7 and detecting arm 9 according to the embodiment.

In the same way as FIG. 4A, it is assumed that the voltages are supplied to the driving arms 7 by the excitation electrodes 15 to make the driving arms 7 flexurally deform to the detecting arm 9 side. At this time, as already explained, the cross-sectional shapes of the driving arms 7 are shapes where the bending stiffness to the detecting arm 9 side and to the +z side is smaller than the bending stiffness to the detecting arm 9 side and to the −z side, therefore the driving arms 7 flexurally deform in directions which are not parallel to the x-axis, but are inclined toward the +z side as indicated by arrows y5.

At this time the detecting arm 9 tries to flex to the inverse side (−z side) to the side of flexing of the driving arms 7 about the z-axis direction as indicated by an arrow y6 so as to balance with the components in the z-axis direction of the displacements of the driving arms 7. As a result, the flexural deformation indicated by the arrow y4 in FIG. 4B is cancelled in part or whole thereof by the flexural deformation indicated by the arrow y6 in FIG. 4C. In turn, the detection error is reduced.

In the above description, the case where the driving arms 7 flexed to the detecting arm 9 side was taken as an example. However, a case where the driving arms 7 flex to the opposite sides to the detecting arm 9 is the same as that described above except that various directions are inverse. Specifically, first, when the driving arms 7 flex to the opposite sides to the detecting arm 9, torsional deformations in which the side surfaces on the detecting arm 9 side in the driving arms 7 displace to the +z side occur. Further, the base part 5 flexes to the +z side, and the detecting arm 9 tries to flex to the −z side. On the other hand, the driving arms 7, due to their cross-sectional shapes, try to flex in the directions which are not parallel to the x-axis, but are inclined to the −z side, and the detecting arm 9 tries to flex toward the +z side. As a result, in the detecting arm 9, part or all of the flexural deformation due to the torsional deformations of the driving arms 7 is cancelled by the flexural deformation due to oblique vibrations of the driving arms 7.

(Method for Manufacturing Sensor Element)

A method for manufacturing the sensor element 1 may be the same as known various methods except for specific matters for realizing the shape of the piezoelectric body 3. For example, first, a wafer from which many piezoelectric bodies 3 can be taken is etched to form the base parts 5, driving arms 7, detecting arms 9, and mounting parts 11. At this stage, the piezoelectric bodies 3 may be maintained in a wafer state by connection through extra margins or may be diced. The etching of the piezoelectric bodies may be wet etching or dry etching. After that, metal layers are formed through a mask. Or the metal layers are formed, then etched through a mask. Thereby the pads 13, excitation electrodes 15, detecting electrodes 17, and wirings 19 are formed.

Figure 5A:
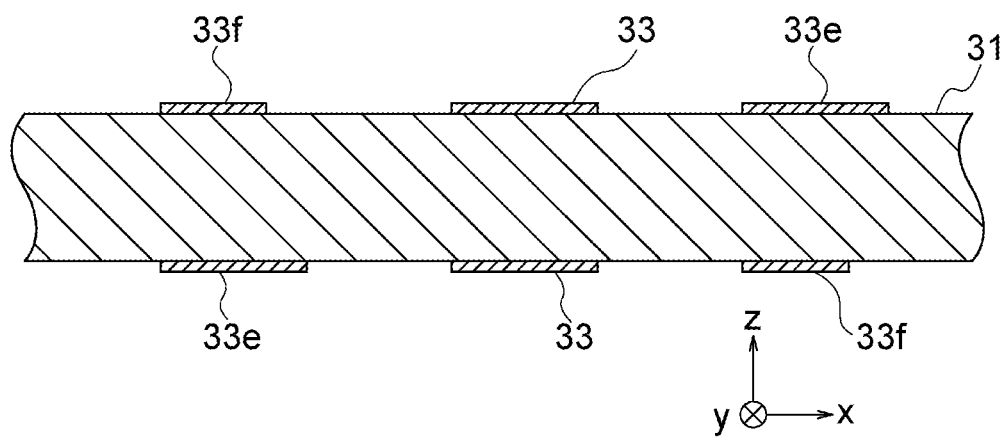
FIG. 5A and FIG. 5B are cross-sectional views for explaining an example of a method for manufacturing the sensor element.
Figure 5B:
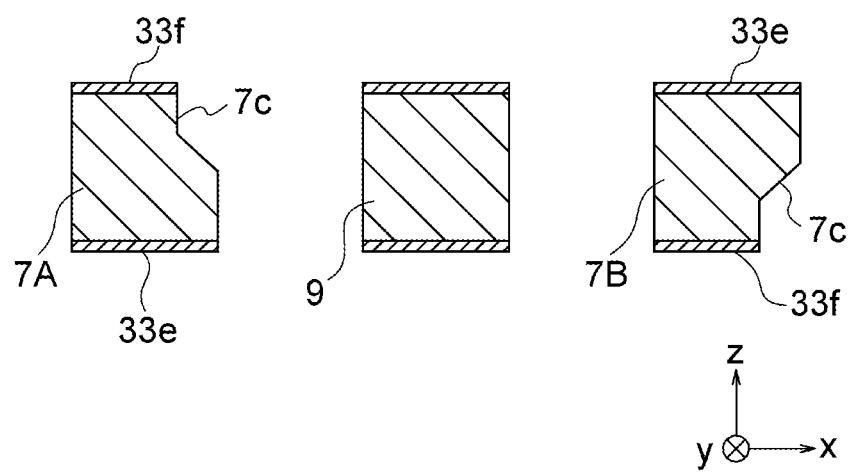

FIG. 5A and FIG. 5B are schematic cross-sectional views for explaining an example of a method for shaping the piezoelectric body 3 by wet etching.

First, as shown in FIG. 5A, masks 33 are formed on the two surfaces of a wafer 31 from which many piezoelectric bodies 3 may be taken. The masks 33 have regions which are superposed on the portions in the wafer 31 which form the parts (base parts 5, driving arms 7, detecting arms 9, and mounting parts 11) in the piezoelectric bodies 3.

In the portions forming the driving arms 7, first regions 33e and second regions 33f are formed. Between the upper and lower surfaces, the first regions 33e are superposed on the sides where no cut away portions 7c are provided. Between the upper and lower surfaces, the second regions 33f are superimposed on the sides where the cut away portions 7c are provided. The second regions 33f are shaped so that the edge parts on the sides where the cut away portions 7c are to be formed are cut away with sizes in accordance with the widths (x-axis direction) of the cut away portions 7c relative to the first regions 33e. In the other portions of the piezoelectric body 3, the shapes of the masks 33 on the upper surfaces and the shapes of the masks 33 on the lower surfaces may be made the same.

Further, the wafer 31 having the masks 33 formed thereon is dipped in a chemical solution and etched from the two surfaces of the wafer 31. At this time, due to the second regions 33f being smaller than the first regions 33e, in the driving arms 7, the side surfaces are etched on the second region 33f side more than on the first region 33e side. As a result, the cut away portions 7c are formed.

Here, when the piezoelectric body 3 is a quartz crystal, the etching speed on the positive side (+X side) of the electrical axis is slower compared with the etching speed on the negative side (−X side) of the electrical axis. On the other hand, as already explained, the x-axis substantially matches with the X-axis. Accordingly, by forming the cut away portions 7c on the +x side of the driving arms 7, for example, residue in the detecting arm 9 etc. is reduced by a long period of etching, while step differences (cut away portions 7c) due to the differences of the widths of the first regions 33e and the second regions 33f can be left in the driving arms 7.

As described above, in the present embodiment, the sensor element 1 has a piezoelectric body 3, a plurality of excitation electrodes 15, and a plurality of detecting electrodes 17. The piezoelectric body 3 has a base part 5 and has driving arms 7 and detecting arm 9 which extend from the base part 5 in the y-axis direction and is configured by a single crystal. The plurality of excitation electrodes 15 are positioned on the driving arms 7 in an arrangement enabling vibration of the driving arms 7 in the x-axis direction. The plurality of detecting electrodes 17 are positioned on the detecting arm 9 in an arrangement enabling detection of the signals generated due to the bending deformation in the z-axis direction of the detecting arm 9. The piezoelectric body 3 has anisotropy relative to the crystal orientation making the driving arms 7 torsionally deform when the driving arms 7 vibrate in the x-axis direction. The orientation of the torsional deformation at the time when the driving arms 7 bend to the +x side is the orientation making the base part 5 flex so that the connection position of the base part 5 and the detecting arm 9 is displaced to one side in the z-axis direction (−z side for the driving arm 7A and +z side for the driving arm 7B). The shape of the cross-section perpendicular to the y-axis direction in the driving arm 7 is a shape where the bending stiffness to the +x side and to the other side in the z-axis direction (+z side for the driving arm 7A and −z side for the driving arm 7B) becomes smaller than the bending stiffness to the +x side and to the one side in the z-axis direction.

Accordingly, if torsional deformations occur in the driving arms 7, as explained with reference to FIG. 4B, the connection portion with the detecting arm 9 in the base part 5 ends up being displaced in the z-axis direction and in turn an unwanted vibration in the z-axis direction occurs in the detecting arm 9. However, as explained with reference to FIG. 4C, part or all of the unwanted vibration of the detecting arm 9 is cancelled by oblique vibrations of the driving arms 7. As a result, the accuracy of the sensor element 1 is improved. In the simulation computations by the inventors of the present application, in a sensor element 1 having a size less than 10 mm, by providing the cut away portions 7c with widths of 0.5 µm (x-axis direction), charges of about $9 \times 10^{-13}$ C due to the unwanted vibrations could be substantially cancelled.

Further, in the present embodiment, the driving arms 7 and the detecting arm 9 are different from each other in the positions in the x-axis direction. The orientations of the torsional deformations when the driving arms 7 bend to the +x side are orientations where the side surfaces of the driving arms 7 on the detecting arm 9 side in the x-axis direction respectively are oriented to the one side in the z-axis direction.

In the case where the positions in the x-axis direction of the driving arms 7 and the detecting arm 9 are different from each other, due to flexing caused in the base part 5 due to the torsional deformations of the driving arms 7, the displacement in the z-axis direction at the connection position of the base part 5 and the detecting arm 9 is apt to occur and in turn an unwanted vibration of the detecting arm 9 is apt to occur. Accordingly, the effect by the cut away portions 7c is valid.

Further, in the present embodiment, the pair of driving arms 7 are positioned on the two sides in the x-axis direction relative to the detecting arm 9. The plurality of excitation electrodes 15 which are positioned on one of the pair of driving arms 7 and the excitation electrodes 15 which are positioned on the other of the pair of driving arms 7 are connected with each other so that the pair of driving arms 7 can vibrate to bend to inverse sides from each other in the x-axis direction.

Accordingly, for example, as explained with reference to FIG. 3A to FIG. 3D, detection becomes possible by a new principle of operation that the base part 5 is flexed (vibrated) in the y-axis direction due to excitation of the pair of driving arms 7, thereby the detecting arm 9 is displaced (vibrated) in the y-axis direction, and the angular velocity is detected due to the Coriolis force which acts upon the displaced detecting arm 9. In this principle of operation, for example, the Coriolis force directly acts upon the detecting arm 9, therefore the detection sensitivity is improved compared with a principle of operation that the Coriolis force acting upon the driving arms is transferred to the detecting arm.

In such a new principle of operation, the base part 5 is designed in its bending stiffness and support structure so that it easily flexes. As a result, in the sensor element 1 of the present embodiment, compared with the sensor element of the other principle of operation, the influence of the torsional deformations of the driving arms 7 exerted upon the flexing of the base part 5 is relatively large. Accordingly, the effect by the cut away portions 7c is exhibited effectively particularly in the present embodiment.

Further, in the present embodiment, both of the pair of driving arms 7 are shaped so that only one side in the x-axis direction (+x side in the present embodiment) between the side surfaces on one side and the other side in the x-axis direction is cut away.

Accordingly, for example, as explained with reference to FIG. 5B, in the case where the etching speed on one side (+x side) in the x-axis direction is slower than the etching speed on the other side (−x side), the cut away portions 7c can be realized while reducing residue by a sufficient etching time. Usually the pair of driving arms 7 are formed in line symmetrical shapes. In the present embodiment, however, the configuration is contrary to this.

Second Embodiment (Sensor Element)

Figure 6:
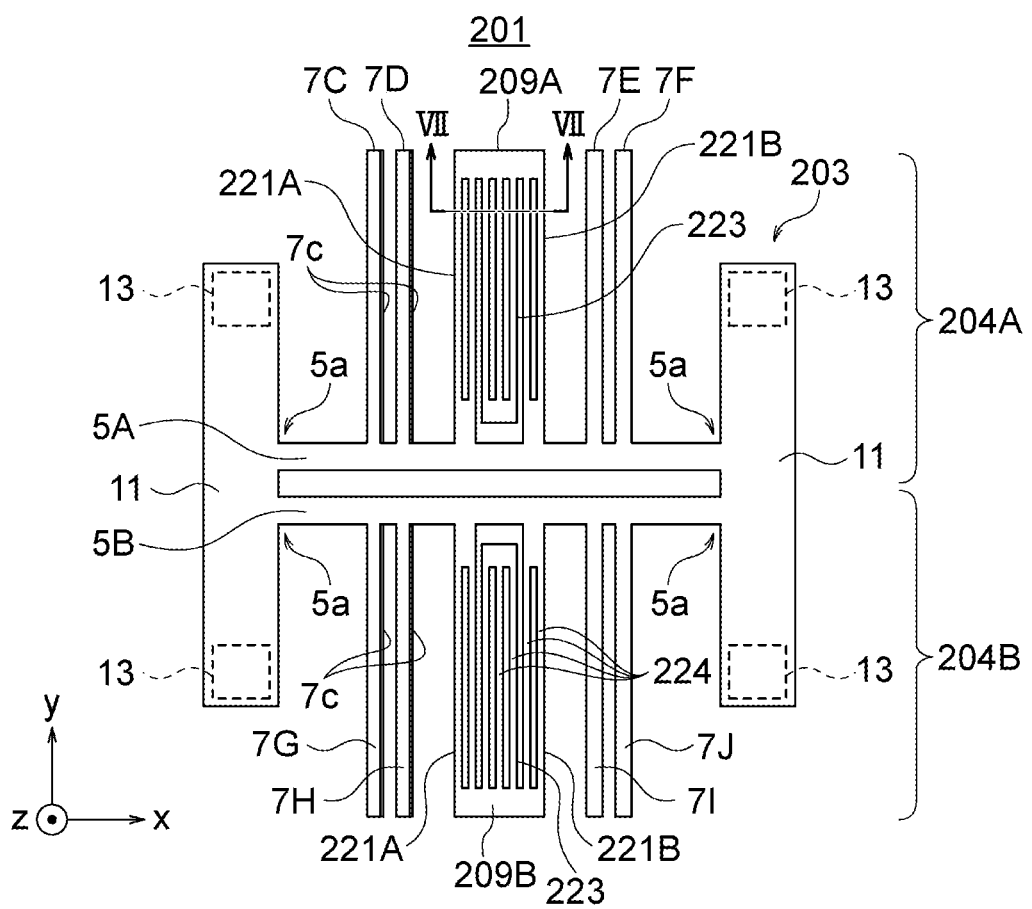
FIG. 6 is a plan view showing the configuration of a sensor element according to a second embodiment.

FIG. 6 is a plan view showing the configuration of a sensor element 201 according to a second embodiment. However, in this view, illustration of a conductive layer provided on the surface of the sensor element 201 is basically omitted.

A piezoelectric body 203 in the sensor element 201, first, is shaped as if two piezoelectric bodies 3 in the first embodiment were combined. That is, the piezoelectric body 203 has two units 204A and 204B. The units 204 have base parts 5 (5A and 5B), at least single pairs of (two pairs in the present embodiment) driving arms 7 (7C to 7J) which extend from the base parts 5 alongside each other in the y-axis direction, and detecting arms 209 (209A and 209B).

The two units 204 are arranged so as to make the sides opposite from the directions of extension of the driving arms 7 and detecting arms 209 face each other and are supported upon a common pair of mounting parts 11. The distance between the two units 204 for example may be suitably set so that the base parts 5A and 5B do not contact each other. The two units 204 are for example mutually the same shape and size (have line symmetrical shapes and sizes relative to a not shown symmetrical axis parallel to the x-axis).

(Driving Arms)

The piezoelectric body 3 in the first embodiment had one pair of driving arms 7 for one base part 5. However, each of the units 204 in the piezoelectric body 203 has two pairs of driving arms 7 with respect to one base part 5. As will be explained later (FIG. 8A and FIG. 8B), two mutually neighboring driving arms 7 (two of 7C and 7D, two of 7E and 7F, two of 7G and 7H, and two of 7I and 7J) are supplied with voltages with the same phase so as to bend together to the same sides of the x-axis direction relative to each other. Accordingly, the two mutually neighboring driving arms 7 may be interpreted as corresponding to one driving arm 7 in the first embodiment. By dividing the driving arm 7 in the first embodiment into two in this way, for example, even if the length of the driving arms 7 is made short, the mass of the driving arms 7 as a whole can be secured and in turn both reduction of size and improvement of the detection sensitivity can be achieved.

As shown in the driving arms 7 on the −x side, in the driving arms 7, in the same way as the first embodiment, the cut away portions 7c are provided. In the unit 204A, the positions of the cut away portions 7c in the driving arms 7 are the same as those in the piezoelectric body 3 in the first embodiment. The driving arms 7 in the unit 204B are inverse in the direction of extension of the driving arms 7 to that in the piezoelectric body 3 in the first embodiment (positive/negative of the y-axis direction are reversed). On the other hand, the torsional deformations of the driving arms 7 are due to the anisotropy defined according to the crystal orientation. Accordingly, when viewed toward the +y side, the positions of the cut away portions 7c in the driving arms 7 are the same between the unit 204B and the piezoelectric body 3 (or unit 204A).

The configurations of the two mutually neighboring driving arms 7 are for example the same as each other. However, they may be different from each other as well. For example, in the example shown, cut away portions 7c are provided in both of the two mutually neighboring driving arms 7. However, a cut away portion 7c may be provided in only one of them as well. Except for the cut away portions 7c, the piezoelectric body 203 is for example line symmetrically shaped relative to a not shown symmetrical axis (detecting arm 9). Also, the shapes and arrangement of the plurality of driving arms 7 are line symmetrical.

(Detecting Arms)

It can be said that the positions and shapes as the entireties of the detecting arms 209 are the same as those of the detecting arm 9 in the first embodiment. That is, the detecting arms 209 are at least positioned between single pairs of the driving arms 7 and extend from the base parts 5 in the y-axis direction.

However, the detecting arms 209 have first arms 221 (221A and 221B) which extend from the base parts 5 and second arms 223 which extend from the front end sides and lateral sides of the first arms 221 to the base part 5 sides. The front ends of the second arms 223 are not connected with the base parts 5, but become free ends. The pair of first arms 221 are line symmetrically shaped relative to a not shown center line of the piezoelectric body 203 and the second arms 223 are positioned between the two. The various dimensions of the first arms 221 and second arms 223 and the size relationships between the two may be suitably set.

Although not particularly shown, one first arm 221 may extend from the base part 5 on the center line of the piezoelectric body 203, and one pair of second arms 223 may extend from the front end of the first arm 221 to the base part 5 on the two sides in the x-axis direction of the first arm.

Further, the detecting arms 209 have one or more via grooves (notation is omitted) which penetrate in the z-axis direction and extend along the detecting arms 209. From another viewpoint, the detecting arms 209 have pluralities of divided arms 224 which extend alongside each other and are connected to each other at the roots and front ends. In the mode where the detecting arms 209 have the first arms 221 and second arms 223 as in the present embodiment, the via grooves may be provided in any of the first arms 221 and second arms 223. In the example shown, they are provided in both.

The number and dimensions of the divided arms 224 may be suitably set. In the example shown, each first arm 221 is configured by two divided arms 224, and each second arm 223 is configured by three divided arms 224.

(Excitation Electrodes, Detecting Electrodes, and Wirings)

Although not particularly shown, in each driving arm 7, for example, in the same way as the driving arms 7 in the first embodiment, two excitation electrodes 15A and two excitation electrodes 15B are provided.

The mutually neighboring two driving arms 7 correspond to one driving arm 7 in the first embodiment and are supplied with voltages with the same phases as each other. Therefore, between these two driving arms 7, the excitation electrodes 15A are rendered the same potentials as each other, and the excitation electrodes 15B are rendered the same potentials as each other.

In each unit 204, the two driving arms 7 which are arranged line symmetrical while sandwiching the detecting arm 209 therebetween correspond to one pair of driving arms 7 in the first embodiment. Therefore, between these two driving arms 7, the excitation electrodes 15A and the excitation electrodes 15B are rendered the same potential.

When focusing on the two units 204, in the driving arms 7 (7C, 7D, 7G, and 7H, or 7E, 7F, 7I, and 7J) which are positioned on the same sides of the detecting arms 9 in the x-axis direction, the excitation electrodes 15A are rendered the same potentials as each other, and the excitation electrodes 15B are rendered the same potentials as each other. Accordingly, if AC voltage is supplied to the plurality of excitation electrodes 15, the driving arms 7 which are positioned on the same side of the detecting arms 9 in the x-axis direction vibrate so as to bend to the same sides as each other in the x-axis direction.

The excitation electrodes 15 to be rendered the same potentials as each other are for example connected to each other by the wirings 19. Further, all excitation electrodes 15 divided into two sets are connected through the wirings 19 to two among the four pads 13 and in turn connected to the driving circuit 103.

Figure 7:
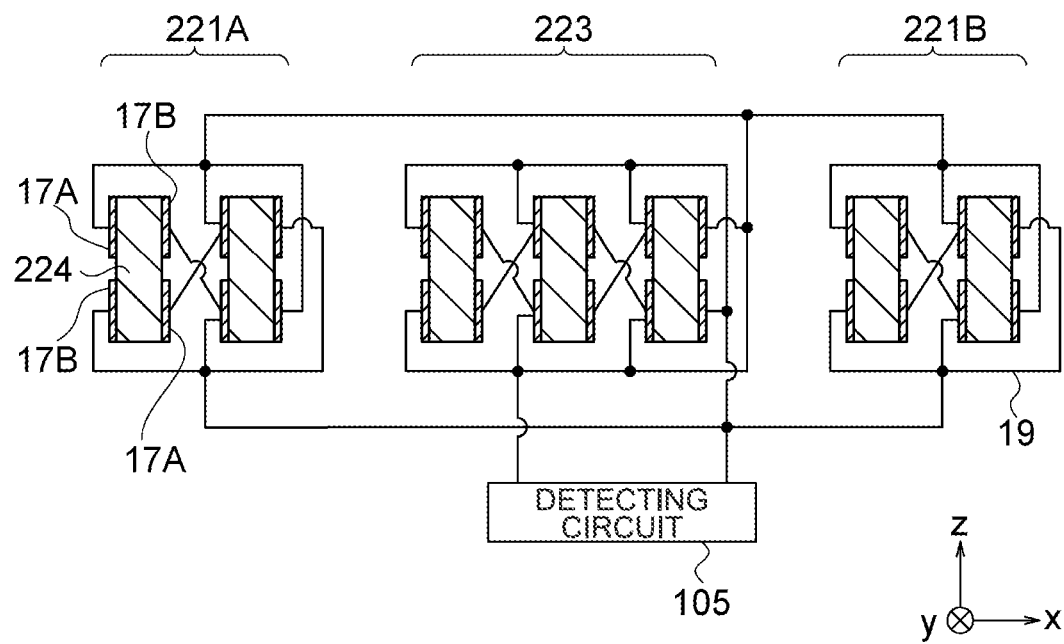
FIG. 7 is a cross-sectional view taken along the VII-VII line in FIG. 6.

FIG. 7 is a cross-sectional view taken along the VII-VII line in FIG. 6.

In the detecting arms 209, for example, the detecting electrodes 17 are provided on the respective first arms 221 and second arms 223. Further, in these arms (221, 223), the detecting electrodes 17 are provided on the respective plurality of divided arms 224.

The arrangements of the detecting electrodes 17 on the divided arms 224 are the same as that in the first embodiment. That is, as indicated by the notations attached to the divided arm 224 on the leftmost side on the drawing sheet, the detecting electrodes 17A on the divided arms 224 are provided in the regions of +z in the side surfaces of −x and the regions of −z in the side surfaces of +x. The detecting electrodes 17B on the divided arms 224 are provided in the regions of −z in the side surfaces of −x and the regions of +z in the side surfaces of +x.

In the divided arms 224, the detecting electrodes 17A are connected to each other and the detecting electrodes 17B are connected to each other. Accordingly, in the same way as the detecting arm 9 in the first embodiment, when the divided arms 224 flex in the z-axis direction, signals in accordance with amounts of flexing of the divided arms 224 are extracted by the detecting electrodes 17A and 17B.

In the respective first arms 221 and second arms 223, among the plurality of divided arms 224, the detecting electrodes 17A are connected to each other and the detecting electrodes 17B are connected to each other. Accordingly, when the arms (221 and 223) flex in the z-direction, in each of the arms, the detection signals of the plurality of divided arms 224 are added. The divided arms 224 may be applied to other embodiments such as first embodiment as well.

In each of the detecting arms 209, the detecting electrodes 17A and the detecting electrodes 17B are connected between the first arms 221 and the second arm 223. Accordingly, when the first arms 221 and the second arm 223 flexurally deform so as to bend to inverse sides from each other in the z-axis direction, their detection signals are added to each other.

Between the two first arms 221, the detecting electrodes 17A are connected to each other and the detecting electrodes 17B are connected to each other. In a case where two second arms 223 are provided on the two sides of one first arm 221 unlike the present embodiment, the detecting electrodes 17A are connected to each other and the detecting electrodes 17B are connected to each other between the two second arms 223.

Between the detecting arm 209A and the detecting arm 209B, the detecting electrodes 17A and the detecting electrodes 17B are connected. In such connection relationships, when the detecting arms 209A and 209B receive Coriolis forces and flexurally deform at inverse sides from each other in the z-axis direction, the signals generated in the two are added.

The plurality of detecting electrodes 17 are for example connected by the wirings 19. All of the detecting electrodes 17 divided into the two sets are connected to two among the four pads 13 by the wirings 19 and in turn connected to the detecting circuit 105.

(Operation of Angular Velocity Sensor)

FIG. 8A and FIG. 8B are schematic plan views showing the excitation state of the piezoelectric body 203 and correspond to FIG. 3A and FIG. 3B in the first embodiment.

The excitation in the units 204 is basically the same as the excitation of the piezoelectric body 3 in the first embodiment. However, as already explained, in the units 204, two driving arms 7 neighboring each other are supplied with voltages with the same phase so as to bend to the same sides relative to each other, therefore correspond to one driving arm 7 in the piezoelectric body 3.

When focusing on the two units 204, between the driving arms 7 which are positioned on the same sides of the detecting arms 209 in the x-axis direction (positive side or negative side), the excitation electrodes 15A are connected to each other and the excitation electrodes 15B are connected to each other as described above, therefore the driving arms 7 positioned on the same side are supplied with voltages with the same phases as each other, so bend to the same side in the x-axis direction. Accordingly, the base parts 5A and 5B flex to inverse sides from each other. Further, the detecting arms 209A and 209B are displaced to inverse sides from each other.

FIG. 8C and FIG. 8D are schematic perspective views for explaining vibrations of the detecting arms 209 due to the Coriolis force in the sensor element 201 and correspond to the states in FIG. 8A and FIG. 8B. In the same way as FIG. 3C and FIG. 3D for the first embodiment, here, illustration of deformations of the base parts 5 and driving arms 7 is omitted.

When the sensor element 201 is rotated around the x-axis in the state where vibrations explained with reference to FIG. 8A and FIG. 8B occur, in the units 204, in the same way as the first embodiment, the detecting arms 209 receive Coriolis forces in the z-axis direction.

As a result, the second arms 223 flexurally deform so as to bend to the directions of the Coriolis forces indicated by arrows y11. Further, the bending moments making the second arms 223 cause such flexural deformations are transferred to the first arms 221 as indicated by arrows y12 and act upon the first arms 221 so as to cause flexural deformations making the first arms 221 bend to the opposite sides to the directions of the Coriolis forces. Accordingly, the first arms 221 and the second arms 223 end up flexurally deforming to inverse sides from each other in the z-axis direction.

The signals generated due to the flexural deformation in the z-axis direction in the respective first arms 221 and second arms 223 are extracted by the detecting electrodes 17. Further, the signals generated in the first arms 221 and second arms 223 are added.

The detecting arms 209A and 209B vibrate with phases of displacement to inverse sides from each other in the y-axis direction, therefore receive Coriolis forces at the same sides relative to the rotation direction around the x-axis. From another viewpoint, the detecting arms 209A and 209B receive Coriolis forces at the inverse sides from each other in the z-axis direction. Further, the signals generated in the two detecting arms 209 are added.

In the above second embodiment as well, the orientations of the torsional deformations when the driving arms 7 bend to the +x side are orientations generating moments making the base parts 5 flex so that the connection positions in the base parts 5 with the detecting arms 209 are displaced to single sides in the z-axis direction (−z side for the driving arms 7C, 7D, 7G, and 7H and +z side for the other driving arms 7). Further, the shapes of the cross-sections of the driving arms 7 perpendicular to the y-axis direction are shapes where the bending stiffness to the +x side and to the other side in the z-axis direction becomes smaller than the bending stiffness to the +x side and to the one side in the z-axis direction.

Accordingly, the same effects as those by the first embodiment are exhibited. For example, parts or all of the unwanted vibrations of the detecting arms 209 due to the torsional deformations of the driving arms 7 can be cancelled by the oblique vibrations of the driving arms 7.

Figure 9:
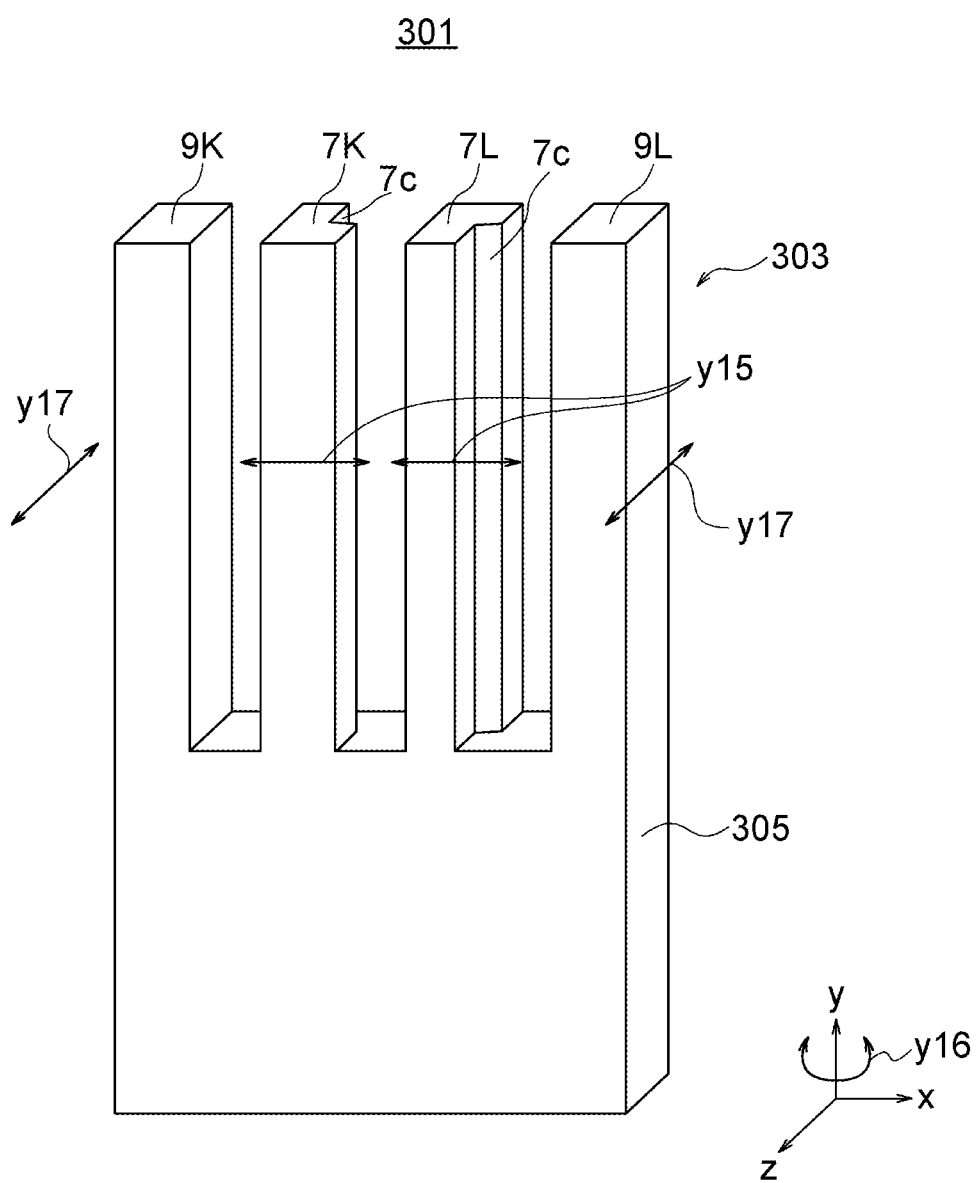
FIG. 9 is a perspective view showing the configuration of a principal part of a sensor element according to a third embodiment.

Further, in the present embodiment, two units 204 corresponding to the piezoelectric body 3 in the first embodiment are provided, two driving arms 7 are provided at the positions where one driving arm 7 was provided in the first embodiment, the detecting arm 209 is configured by a plurality of divided arms 224, and the detecting arm 209 is configured by the first arms 221 and second arms 223. Due to this, for example, both the reduction of size and improvement of the detection sensitivity of the sensor element 201 can be achieved Third Embodiment FIG. 9 is a perspective view showing the configuration of the principal part of a sensor element 301 according to a third embodiment. In this view, only a piezoelectric body 303 in the sensor element 301 is shown, and illustration of the excitation electrodes 15, detecting electrodes 17, and the like is omitted.

The piezoelectric body 303 has a base part 305, a pair of driving arms 7K and 7L which extend from the base part 305 alongside each other in the y-axis direction, and a pair of detecting arms 9K and 9L which extend from the base part 305 alongside each other in the y-axis direction on outer sides of the pair of driving arms 7K and 7L.

The configurations of the driving arms 7 and detecting arms 9 may be basically the same as those in the first embodiment. However, the positions of the cut away portions 7c differ from those in the first embodiment. Specifically, when considering that the driving arm 7K corresponds to the driving arm 7A and the driving arm 7L corresponds to the driving arm 7B, the positions in the z-axis direction of the cut away portions 7c become inverse to those in the first embodiment. From another viewpoint, the positions of the cut away portions 7c are the same between the driving arm 7K and driving arm 7B and are the same between the driving arm 7L and the driving arm 7A. As will be understood from the operation which will be explained later, the basic thinking of positioning of the cut away portions 7c is the same as that in the first embodiment.

On the driving arms 7 and detecting arms 9, the arrangements of the excitation electrodes 15 and detecting electrodes 17 are the same as those in the first embodiment. Further, the connection relationships of the excitation electrodes 15 between the pair of driving arms 7 are the same as those in the first embodiment. The detecting electrodes 17A and the detecting electrodes 17B are connected between the pair of detecting arms 9. That is, when the pair of detecting arms 9 flex to inverse sides from each other in the z-axis direction, the signals of the two are added.

The shape and dimensions of the base part 305 may be suitably set. For example, compared with the first embodiment, the length in the y-axis direction relative to the length in the x-axis direction may be set longer. On the surface of this base part 305 perpendicular to the z-axis, not shown pads for mounting the sensor element 301 on a not shown mounting substrate may be formed. As in the first embodiment, one pair of mounting parts 11 may be provided and the pads may be provided on their front ends.

In such a configuration, by application of voltages by the excitation electrodes 15, as indicated by arrows y15, the pair of driving arms 7 vibrate so as to flex to inverse sides from each other in the x-axis direction. As a result, the detecting arm 9K neighboring the driving arm 7K vibrates so as to flex in the x-axis direction with the inverse phase to that of the driving arm 7K so as to balance with the displacement of the driving arm 7K. The same is true for the driving arm 7L and detecting arm 9L.

When the sensor element 301 rotates around the y-axis as indicated by an arrow y16 in the above state, the Coriolis force in the z-axis direction acts upon the pair of detecting arms 9. Further, the pair of detecting arms 9 vibrate so as to flex to inverse sides from each other in the z-axis direction. The signals generated due to this flexing are extracted by the detecting electrodes 17.

In such a configuration as well, due to the torsional deformations of the driving arms 7, flexural deformation of the base part 305 in the z-axis direction may occur. Specifically, in the same way as the first embodiment, at the time when the pair of driving arms 7 bend to inner sides, the base part 305 flexes in a direction where the center side is displaced to the −z side. In turn, unwanted vibrations occur in the detecting arms 9. However, the detecting arms 9, converse to the first embodiment, are positioned on outer sides of the pair of driving arms 7, therefore the direction (phase) of the unwanted vibrations are inverse to that in the first embodiment.

Further, the same cut away portions 7c as those in the first embodiment are provided while making the positions in the z-axis direction inverse to those in the first embodiment, therefore part of all of the unwanted vibrations due to the torsional deformations are cancelled by the oblique vibrations of the driving arms 7.

As explained in the first embodiment, in the case where the orientations of the torsional deformations at the time when the driving arms 7 bend to the +x side are orientations generating moments making the base part 305 flex so that the connection positions in the base part 305 with the detecting arms 9 are displaced to one side in the z-axis direction, if the shapes of the cross-sections of the driving arms 7 perpendicular to the y-axis direction are shapes where the bending stiffness to the +x side and to the other side in the z-axis direction becomes smaller than the bending stiffness to the +x side and to the one side in the z-axis direction, part or all of the unwanted vibrations can be cancelled.

In the third embodiment, the relationships as described above stand between the driving arm 7K and the detecting arm 9K and between the driving arm 7L and the detecting arm 9L first. Assuming that the number of the driving arm 7 is one, the relationships described above do not stand between this driving arm 7 and the detecting arm 9L or between this driving arm 7 and the detecting arm 9K. However, by the pair of driving arms 7 being vibrated with inverse phases, the relationships described above stand also between the driving arm 7K and the detecting arm 9L and between the driving arm 7L and the detecting arm 9K.

Fourth Embodiment

Figure 10:
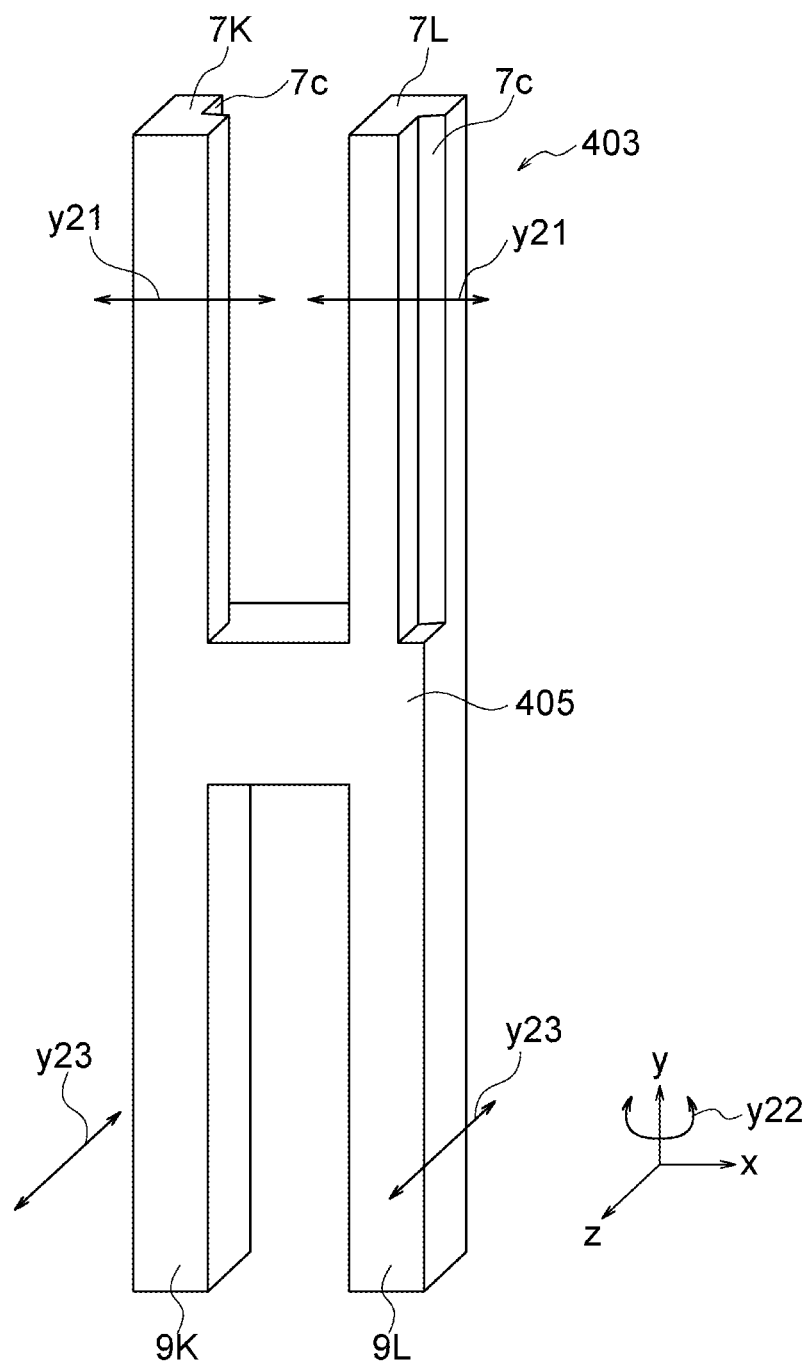
FIG. 10 is a perspective view showing the configuration of the principal part of a sensor element according to a fourth embodiment.

FIG. 10 is a perspective view showing the configuration of the principal part of a sensor element 401 according to a fourth embodiment. In this view, only a piezoelectric body 403 in the sensor element 401 is shown, and illustration of the excitation electrodes 15, detecting electrodes 17, and the like is omitted.

The piezoelectric body 403 has a base part 405, a pair of driving arms 7K and 7L which extend from the base part 405 alongside each other in the y-axis direction, and a pair of detecting arms 9K and 9L which extend from the base part 305 alongside each other in the y-axis direction. The direction of extension of the pair of driving arms 7 and the direction of extension of the pair of detecting arms 9 are inverse sides from each other. From another viewpoint, the driving arms 7 and the detecting arms 9 do not extend alongside each other, but extend in series relative to each other. The configurations of the driving arms 7 and detecting arms 9 themselves may be the same as those in the third embodiment.

On the driving arms 7 and detecting arms 9, the arrangements of the excitation electrodes 15 and detecting electrodes 17 are the same as those in the first embodiment. Further, the connection relationships of the excitation electrodes 15 between the pair of driving arms 7 are also the same as those in the first embodiment. Between the pair of detecting arms 9, the detecting electrodes 17A and the detecting electrodes 17B are connected. That is, when the pair of detecting arms 9 flex to inverse sides from each other in the z-axis direction, the signals of the two are added.

The shape and dimensions of the base part 405 may be suitably set. For example, compared with the first embodiment, the length in the y-axis direction relative to the length in the x-axis direction is set longer. On the surface of this base part 405 perpendicular to the z-axis, not shown pads for mounting the sensor element 401 on a not shown substrate may be formed. As in the first embodiment, in the sensor element 401, one pair of mounting parts 11 may be provided and the pads may be provided on the front ends thereof.

In such a configuration, by application of voltages by the excitation electrodes 15, as indicated by arrows y21, the pair of driving arms 7 vibrate so as to flex to inverse sides from each other in the x-axis direction. When the sensor element 401 rotates around the y-axis as indicated by an arrow y22 in the above state, the Coriolis force in the z-axis direction acts upon the pair of driving arms 7. As a result, the pair of driving arms 7 vibrate so as to flex to inverse sides from each other in the z-axis direction. The detecting arm 9K, as indicated by an arrow y23, vibrates so as to flex to the inverse side in the z-axis direction relative to the driving arm 7K so as to balance with the displacement of the driving arm 7K. The same is true for the detecting arm 9L and driving arm 7L. That is, the pair of detecting arms 9 vibrate so as to flex to inverse sides from each other in the z-axis direction. The signals generated due to this flexing are extracted by the detecting electrodes 17.

In such a configuration as well, due to the torsional deformations of the pair of driving arms 7, in the base part 405, in the same way as the first embodiment, flexural deformation where the center part is relatively displaced in the z-axis direction may occur. The detecting arms 9 are positioned on the two sides of the base part 405, therefore the phases of the unwanted vibrations in the z-axis direction in the detecting arms 9 are the same as those in the third embodiment. Further, by provision of the cut away portions 7c, part or all of the unwanted vibrations due to the torsional deformations can be cancelled by the oblique vibrations of the driving arms 7.

The art according to the present disclosure is not limited to the above embodiments and may be executed in various ways.

The piezoelectric body is not limited to a quartz crystal. Also, the relative relationships of the X-axis, Y-axis, and Z-axis (in other words, crystal orientations) and the shape of the piezoelectric body (directions of extension of the driving arms and detecting arms and the like) are not limited to those illustrated in the embodiments. The piezoelectric body may be a material capable of causing torsional deformation when making the driving arms vibrate in the x-axis direction (vibration direction).

The arrangements, numbers, and operation modes of the driving arms and detecting arms are not limited to those exemplified as the embodiments. The sensor element only have to be one making the driving arms vibrate in the x-axis direction (vibration direction) and outputting a signal in accordance with the angular velocity by the vibration in the z-axis direction of the detecting arm. For example, only one driving arm may be provided or the pair of driving arms may vibrate with the same phases as each other.

Also, the shapes of the parts in the piezoelectric body may be various ones. For example, the driving arms and/or detecting arm may be hammer shaped with widths (x-axis direction) becoming broader at the front end side portion as well. Further, the driving arms may be provided with one or more recessed grooves extending along the long direction of the driving arms (the recessed groove may be configured by a plurality of concave portions arranged in the long direction of the driving arm as well) in the upper surfaces and/or lower surfaces as well. In this case, the excitation electrodes (15A) which are provided on the upper surfaces and/or lower surfaces are for example provided over the interiors of the recessed grooves and face the excitation electrodes (15B) on the side surfaces.

The cross-sectional shape of the driving arms is not limited to a rectangular shape with one corner portion cut away. For example, a convex portion may be provided in a direction in which the bending stiffness is to be raised or two corner portions in a direction of a diagonal line in which the bending stiffness is to be weakened may be cut away.

The cross-sectional shapes of the driving arms for making the driving arms obliquely vibrate (for example cross-sectional shapes provided with cut away portions) need not be formed over the entire lengths of the driving arms and may be provided only in single parts in the length directions of the driving arms.

For example, the cut away portions may be provided only in parts on the root side of the driving arms as well. In this case, for example, the mass of the driving arms can be secured and the symmetry of the inverse piezoelectric effects can be secured while making the oblique vibrations larger since the influence of the second moment of area of the driving arm exerted upon the vibration of the driving arm becomes larger toward the root side of the driving arm.

Further, for example, in cross-sectional shapes of the driving arms, the shapes causing oblique vibration in the driving arms may be provided over ¼ or more or ½ or more of the entire lengths of the driving arms. In this case, for example, the effect of causing oblique vibration can be sufficiently generated. The range not less than ¼ or not less than ½ of the entire lengths described above is for example secured on the sides closer to the roots than the front ends of the excitation electrodes.

REFERENCE SIGNS LIST

1 . . . sensor element, 3 . . . piezoelectric body, 5 . . . base part, 7 . . . driving arm, 9 . . . detecting arm, 15 . . . excitation electrode, and 17 . . . detecting electrode.

The invention claimed is:

1. A sensor element comprising:
a piezoelectric body of a single crystal, comprising
a base part, and
a driving arm and a detecting arm which extend from the base part in a y-axis direction in an orthogonal coordinate system xyz,
a plurality of excitation electrodes located on the driving arm in an arrangement enabling vibration of the driving arm in an x-axis direction, and
a plurality of detecting electrodes located on the detecting arm in an arrangement enabling detection of a signal generated due to bending deformation in a z-axis direction of the detecting arm, wherein
the piezoelectric body has anisotropy relative to a crystal orientation, the anisotropy making the driving arm cause vibration of torsional deformation when the driving arm vibrates in the x-axis direction,
an orientation of the torsional deformation when the driving arm bends to a +x side is an orientation making the base part flex so that a connection position in the base part with the detecting arm is displaced to a one side in the z-axis direction, and
a shape of a cross-section of the driving arm perpendicular to the y-axis direction is a shape where a bending stiffness to the +x side and to an other side in the z-axis direction is smaller than a bending stiffness to the +x side and to the one side in the z-axis direction.

2. The sensor element according to claim 1, wherein:
the driving arm and the detecting arm are different from each other in positions in the x-axis direction, and
the orientation of the torsional deformation when the driving arm bends to the +x side is an orientation where a side surface in the driving arm on a detecting arm side in the x-axis direction heads to the one side in the z-axis direction.

3. The sensor element according to claim 2, wherein:
a pair of driving arms are located on two sides of the x-axis direction relative to the detecting arm, and
the plurality of excitation electrodes on one of the pair of driving arms and the plurality of excitation electrodes on the other of the pair of driving arms are connected to each other so that the pair of driving arms can vibrate so as to bend to inverse sides from each other in the x-axis direction.

4. The sensor element according to claim 3, wherein each of the pair of driving arms has a shape where, between side surfaces on a one side and an other side in the x-axis direction, only the side surface on the one side in the x-axis direction is cut away.

5. The sensor element according to claim 1, wherein:
the piezoelectric body is a quartz crystal having an x-axis, a y-axis and a z-axis in the orthogonal coordinate system xyz,
the x-axis has an inclination angle of −10° to 10° relative to an X-axis as an electrical axis,
the y-axis has an inclination angle of −10° to 10° relative to a Y-axis as a mechanical axis,
the z-axis has an inclination angle of −10° to 10° relative to a Z-axis as an optical axis, and
the one side in the z-axis direction is a side corresponding to a negative side of the Z-axis.

6. The sensor element according to claim 5, wherein the driving arm is shaped so that, between side surfaces on a positive side and negative side of the X-axis, only a side surface on the positive side is cut away.

7. The sensor element according to claim 1, wherein, in the driving arm, the shape where the bending stiffness to the +x side and to the other side in the z-axis direction is smaller than the bending stiffness to the +x side and to the one side in the z-axis direction extends over ¼ or more of a total length of the driving arm.

8. An angular velocity sensor comprising:
a sensor element according to claim 1,
a driving circuit supplying voltage to the plurality of excitation electrodes, and
a detecting circuit detecting the signal from the plurality of detecting electrodes.

* * * * *